US012719477B2

(12) United States Patent
Milani et al.

(10) Patent No.: US 12,719,477 B2
(45) Date of Patent: Aug. 25, 2026

(54) ELECTRONIC COMPUTING DEVICE FOR GENERATING BOOLEAN FUNCTIONS AND CONDUCTIVE MODULE THEREOF

(71) Applicant: UNIVERSITA' DEGLI STUDI DI MILANO, Milan (IT)

(72) Inventors: Paolo Milani, Milan (IT); Matteo Mirigliano, Milan (IT); Bruno Paroli, Milan (IT)

(73) Assignee: UNIVERSITA' DEGLI STUDI DI MILANO, Milan (IT)

( * ) Notice: Subject to any disclaimer, the term of this patent is extended or adjusted under 35 U.S.C. 154(b) by 550 days.

(21) Appl. No.: 18/036,433

(22) PCT Filed: Nov. 4, 2021

(86) PCT No.: PCT/IB2021/060210
§ 371 (c)(1),
(2) Date: May 11, 2023

(87) PCT Pub. No.: WO2022/101742
PCT Pub. Date: May 19, 2022

(65) Prior Publication Data

US 2023/0327672 A1 Oct. 12, 2023

(30) Foreign Application Priority Data

Nov. 11, 2020 (IT) ........................ 102020000026900

(51) Int. Cl.
*H03K 19/02* (2006.01)

(52) U.S. Cl.
CPC .................................... *H03K 19/02* (2013.01)

(58) Field of Classification Search
None
See application file for complete search history.

(56) References Cited

U.S. PATENT DOCUMENTS 6,475,911 B1 * 11/2002 Lane ...................... H10D 1/692 257/E21.312
2004/0063915 A1 * 4/2004 Diner ................. C23C 18/1893 530/391.1
2011/0110019 A1 * 5/2011 Varade .................. H01G 11/26 427/78

FOREIGN PATENT DOCUMENTS

FR 2558643 A1 7/1985

OTHER PUBLICATIONS

Ye Zhou et al "A low voltage programmable unipolar inverter with a gold nanoparticle monolayer on plastic" Nanotechnology, Institute of Physics Publishing, GB, vol. 24, No. 205202, Apr. 2013.

(Continued)

*Primary Examiner* — Jany Richardson
(74) *Attorney, Agent, or Firm* — ArentFox Schiff LLP; Michael Fainberg

(57) ABSTRACT

The invention relates to an electronic computing device for generating Boolean functions. The device comprises a conductive module comprising one or more first electrodes, to allow the application of electrical input signals to the conductive module, and one or more second electrodes, to make available electrical output signals from the conductive module. The device comprises one or more input terminals, each of which is selectively connectible to one of said one or more first electrodes for applying electrical input signals to said first electrodes during a step of processing of the device, and one or more output terminals, each of which is selectively connectible to one of said second electrodes to make electrical output signals available on said second electrodes during the step of processing.

18 Claims, 6 Drawing Sheets

(56) References Cited

OTHER PUBLICATIONS

Fan et al "Charge Transport through Self-Assembled Monolayers of Compounds of Interest in Molecular Electronics", Journal of the American Chemical Society, American Chemical Society, vol. 124, Jan. 1, 2002 (Jan. 1, 2002), pp. 5550-5560.

Office Action received for European Patent Application No. 21807280.9, mailed on May 7, 2026, 7 pages.

* cited by examiner

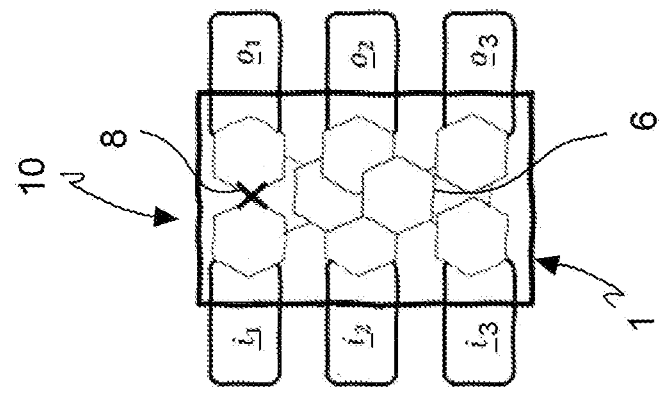
FIG. 1C
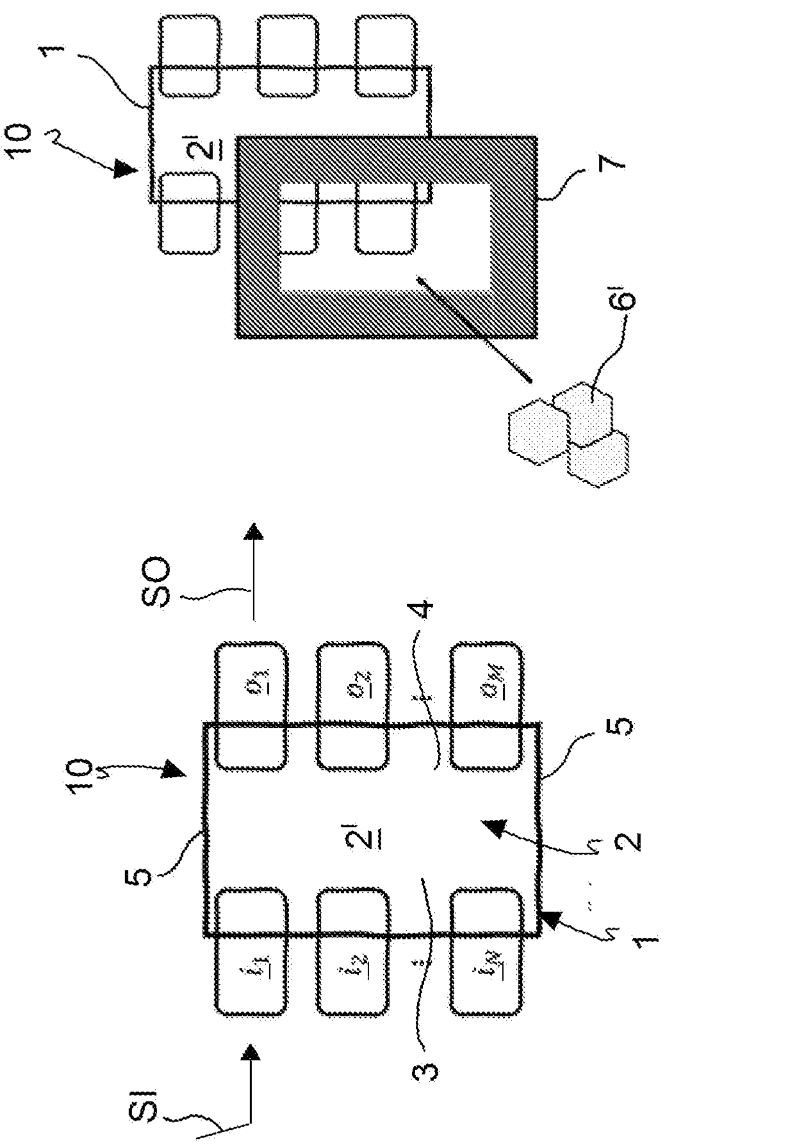
FIG. 1B
FIG. 1A

ELECTRONIC COMPUTING DEVICE FOR GENERATING BOOLEAN FUNCTIONS AND CONDUCTIVE MODULE THEREOF

CROSS-REFERENCE TO RELATED APPLICATIONS

This application is a National Phase Application of PCT International Application No. PCT/IB2021/060210, having an International Filing Date of Nov. 11, 2021 which claims priority to Italian Application No. 102020000026900 filed Nov. 11, 2020, each of which is hereby incorporated by reference in its entirety.

FIELD OF THE INVENTION

The present invention relates in general to the sector of machine learning devices and systems employed in artificial neural networks for classifying patterns. In particular, the invention relates to an electronic computing device for generating Boolean functions and a conductive module of such computing device.

BACKGROUND OF THE INVENTION

As known, artificial neural networks (ANN) have been developed to mimic the general characteristics of data handling and manipulation by the human brain to perform tasks such as, e.g., pattern recognition, with high performance efficiency at a low energy cost.

A known device which can be used for pattern classification is called a "perceptron". Such a device consists of a single-node artificial neural network. Such a neural network is based on the McCulloch-Pitts nonlinear neuron model. In more detail, a perceptron consists of a single "neuron" with synaptic weights and biases adjustable to classify linearly separable functions. Neural networks formed by a plurality of perceptrons are particularly efficient for pattern recognition tasks, in particular when both input and output vectors from the network are binary. Therefore, the interest in implementing arbitrary Boolean functions through the use of such devices has recently grown.

The Boolean function generators of known type comprise a perceptron which is activated when the weighted sum of the input signals, either voltage or current, reaches a threshold value. Memristor devices have recently been suggested for physically implementing a perceptron or a network of perceptrons adapted to implement a limited number of Boolean functions.

In general, the use of memristors introduced the possibility of manufacturing analog systems capable of encoding perceptron synaptic weights directly in the memristor conductance. The use of memristors allows high packing density and represents an approach to large-scale computing inspired by the principle of neuron activation in the human brain.

To date, "neuromorphic" systems comprising perceptrons are made using CMOS technology.

In particular, computing devices of known type based on CMOS components or hybrid architectures comprising memristors and CMOS have been suggested to implement logic gates and/or combinational logic circuits using logic gates of complex nature. At the moment, the use of CMOS components appears unavoidable since computing devices would not be reliable if they relied only on memristors.

However, making computing devices based on CMOS components has the disadvantage of requiring a large number of components, which affects the overall cost of such devices. Furthermore, known-type computing devices have limitations related to the difficulty of large-scale manufacturing and integration of reliable memristors.

SUMMARY OF THE INVENTION

Therefore, it is an object of the present invention to make available a novel electronic computing device for generating Boolean functions, as well as a conductive module of such an electronic device, which allow overcoming, at least partially, the limitations of computing devices of the known type made using CMOS technology.

It is another object of the invention to provide a novel electronic computing device for generating Boolean functions which is modular in nature, i.e. which can be combined with other similar devices to form sets of Boolean functions or combinations of Boolean functions.

It is another object of the invention to provide a computational electronic device for generating Boolean functions having a structure which can be implemented by a simpler manufacturing process than that employed in CMOS technology and is of low cost.

It is another object of the invention to provide an electronic computing device for generating Boolean functions having a conductive module or active element comprising a plurality of interconnected resistive switching junctions obtained by assembling crystalline nanoparticles of noble metals, produced in the gaseous phase, and deposited on an appropriate surface of a rigid or flexible substrate.

It is a further object of the invention to provide an electronic computing device for generating Boolean functions having a conductive module in which the resistance of the aforesaid interconnected resistive switching junctions can be changed by the application of a continuous or pulsed voltage.

Such objects are achieved by a conductive module of an electronic computing device according to claim 1 and by an electronic computing device for generating Boolean functions according to claim 13.

The aforesaid purposes of the invention are achieved by providing an electronic computing device having a conductive module, which comprises one or more input electrodes for receiving one or more input signals, one or more output electrodes for making available one or more output signals, a continuous metallic layer or continuous metallic film having a thickness of several tens of nanometers deposited on a substrate to connect said one or more input electrodes to said one or more output electrodes, such continuous film being made by assembling crystalline particles, in particular crystalline nanoparticles, of a noble metal; wherein each of such crystalline particles (or nanoparticles) is in contact with one or more of said other crystalline particles (or nanoparticles) of the continuous metallic film to form one or more grain boundaries.

An electrical resistance associated with a plurality of conductive paths within the metallic film assembled with nanoparticles is changeable, e.g., from a low resistance state to a high resistance state, following the application of any combination of the input electrodes and the output electrodes of an appropriate voltage of amplitude either greater than or equal to a threshold value.

The value of such threshold voltage depends on the thickness, structure, and chemical composition of the film assembled with nanoparticles.

The electronic computing device as described above can be used to generate elementary Boolean functions, such as, e.g., the Boolean algebra NOT, OR, AND, XOR functions, or complex Boolean functions. Such elementary functions can be combined to formulate further Boolean functions.

Preferred and advantageous embodiments of the electronic computing device for generating Boolean functions and the conductive module thereof are the subject of the dependent claims.

The present invention also relates to a method for generating Boolean functions according to claim 16 and a method of manufacturing a conductive module according to claim 18.

BRIEF DESCRIPTION OF THE DRAWINGS

Further features and advantages of the invention will be apparent from the following description of a preferred embodiment given by way of non-limiting examples, with reference to the accompanying figures, in which:

FIGS. 1A, 1B, 1C illustrate an example of a conductive module of an electronic computing device for generating Boolean functions of the present invention in a plan view in three successive moments of the manufacturing process;

FIGS. 5, 5A respectively illustrate an example of an embodiment of an electronic computing device of the invention, having a conductive module which comprises an input electrode and an output electrode, which implements a one-input and one-output logic gate, and a transfer function of a threshold comparator of the computing device;

FIG. 7 diagrammatically illustrates a combination of three electronic computing devices of the invention through OR operations to obtain a final function through three different goal functions;

Similar or equivalent elements in the aforesaid figures are indicated by means of the same reference numerals.

DETAILED DESCRIPTION

Figures 2A, 2B, 2C:
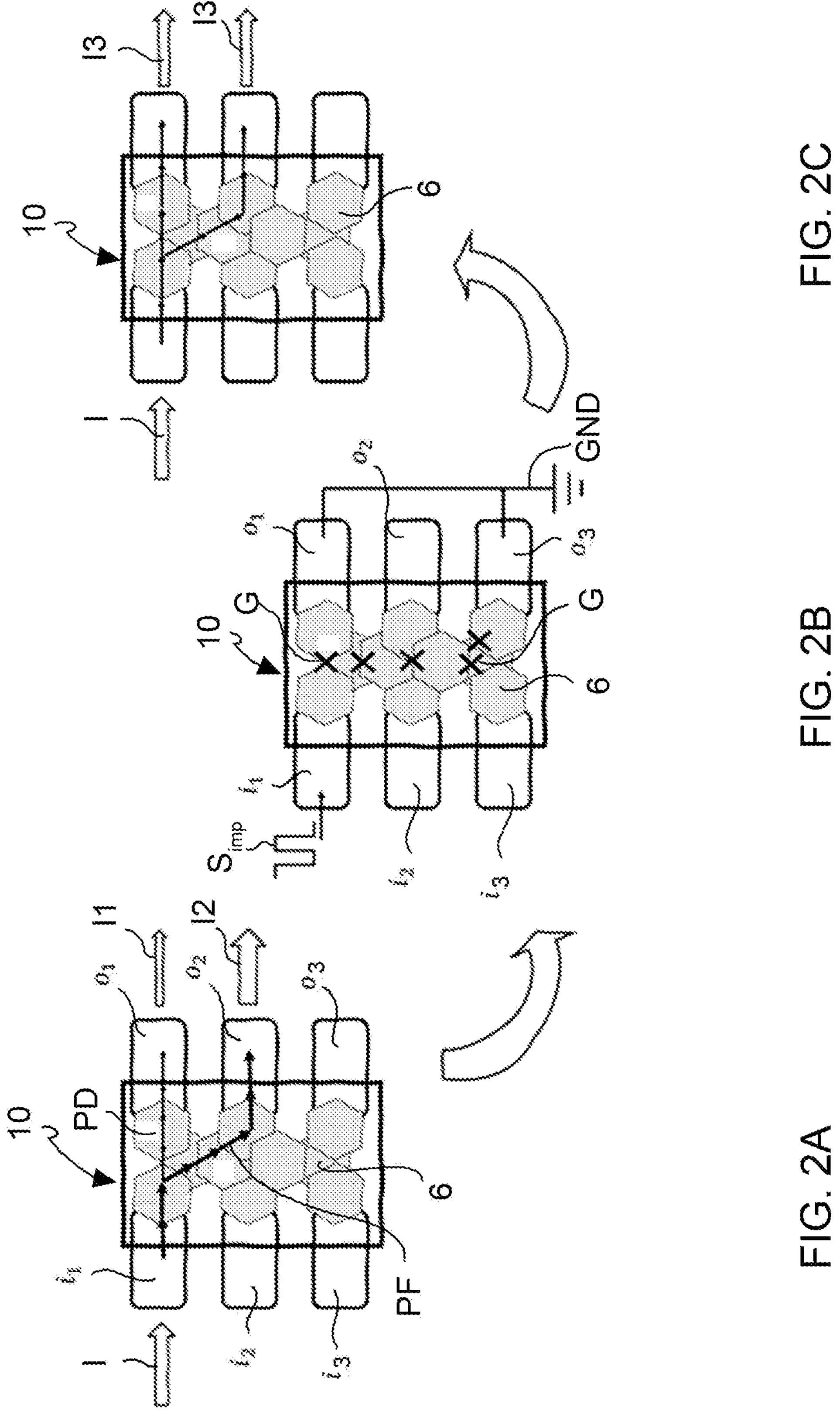
FIGS. 2A, 2B, 2C illustrate the conductive module in FIG. 1C in a plan view at three successive times, in which the resistance between an input electrode and an output electrode is changed as a result of the application between such electrodes of a voltage or current of amplitude either greater than or equal to a threshold value.

With reference to FIGS. 1A, 1B, 1C, a conductive module of an electronic computing device for generating Boolean functions according to the present invention is collectively referred to by reference numeral 10.

Such a conductive module 10, or simply module, comprises a substrate 1 comprising a surface 2, e.g. flat. In particular, such a surface is delimited by a first boundary 3 and an opposite second boundary 4 connected to each other by connecting boundaries 5.

Such a substrate 1 comprises, for example, a solid substrate comprising silicon or glass, or a flexible substrate comprising polymeric materials.

Such a conductive module 10 comprises one or more first electrodes or input electrodes i1, i2, . . . , iN operatively associated with said surface 2 of the substrate 1 to allow the application of electrical input signals SI to the module 10.

Furthermore, the conductive terminals 10 comprises one or more second electrodes o1, o2, . . . , oM operatively associated with said surface 2 of the substrate 1 to make available electrical output signals SO from the module 10.

In greater detail, said one or more first electrodes i1, i2, . . . , iN and said one or more second electrodes o1, o2, . . . , oM delimit a portion 2' of said surface of the substrate 1.

Referring to the example of FIGS. 1A, 1B, 1C, the input electrodes i1, i2, . . . , iN are connected to the first boundary 3 of the surface 2 of the substrate 1 and the output electrodes o1, o2, . . . , oM are connected to the second boundary 4 of the surface of the substrate 1.

It is worth noting that the shape of the input and output electrodes, the number and the arrangement of such input and output electrodes on the substrate 1 is arbitrary, i.e., such features can be customized.

The conductive module 10 comprises a continuous metallic film or continuous metallic sheet 6 formed by deposition on the substrate 1 of a plurality of crystalline particles 6', in particular crystalline nanoparticles, of a noble metal, e.g. gold.

Advantageously, the metallic film 6 is continuous because each such crystalline particle 6' is in contact with one or more of the other crystalline particles of the metallic film 6 to form one or more grain boundaries. In other words, the crystalline particles 6' of the metallic film 6 are in direct mutual contact without the interposition of any oxide or polymer layer.

As known, the term grain boundary denotes the interface between two grains of a polycrystalline material. The grain boundaries are planar crystalline defects, in particular of metals, which occur when two crystals or nanocrystals are in mutual contact. In the present case, the grain boundaries are nanometer in size.

In particular, such metal particles are 6' metal nanoparticles produced in the gaseous phase. Furthermore, said metal nanoparticles 6' are deposited, through an appropriate mask 7, on the portion 2' of the surface of the substrate 1 interposed between the input electrodes and the output electrodes so that said continuous metallic film 6 electrically connects each of said one or more input electrodes i1, i2, . . . , iN with each of said one or more output electrodes o1, o2, . . . , oM.

According to an example of the invention, the conductive module 10 is characterized in that any one of the aforesaid one or more first electrodes i1, i2, . . . , iN is connected to one of the one or more second electrodes o1, o2, . . . , oM by means of one or more respective conductive current paths selected within the continuous metallic film 6. In particular, an electrical resistance associated with said one or more conductive current paths may be modified, e.g. reversibly, from a first resistance value, e.g. a low resistance value, to a second resistance value, e.g. a high resistance value, following the application of an electrical encoding signal Simp adapted to generate a voltage, between any one of said one or more first electrodes i1, i2, . . . , iN and one of the one or more second electrodes o1, o2, . . . , oM connected by the selected conductive current path, having an amplitude greater than or equal to a threshold voltage value VTH.

In an embodiment, such a continuous metallic film 6 has a thickness comprised between 15 nm and 100 nm and a porosity of up to 0.5 times the porosity of the solid metal.

In a further embodiment, such a continuous metallic film 6 has a thickness comprised between 30 nm and 60 nm and a porosity of up to 0.5 times the porosity of the solid metal.

In a further embodiment, the crystalline particles 6' of noble metal which form the continuous metallic film 6 are gold nanoparticles, each having an average diameter comprised between 1 nm and 15 nm.

Such values of film thickness 6 and particle size ensure optimal performance by the conductive module 10.

In a further embodiment, the continuous metallic film 6 of the conductive module 10 is a multilayer film consisting of two or more superimposed layers of crystalline particles 6' of noble metal.

In an embodiment, the electrical encoding signal Simp is a voltage or current signal. In particular, such an electrical encoding signal Simp is a continuous signal or a signal formed by a train of pulses.

It is worth noting that the aforesaid continuous metallic film 6 formed by depositing said plurality of crystalline particles 6' of a noble metal comprises a plurality of non-linear junctions 8 configured to form the aforesaid conductive current paths within the metallic film 6 between each of said one or more first electrodes i1, i2, . . . , iN and any one of the one or more second electrodes o1, o2, . . . , oM. Such conductive current paths have a mutually different electrical resistance.

FIG. 1C shows, in particular, an example of a conductive module 10 according to the invention comprising three input electrodes i1, i2, i3, and three output electrodes o1, o2, o3. In particular, the continuous metallic film 6 which connects the six electrodes of the conductive module 10 to one another comprises a plurality of nanojunctions 8 and grain boundaries between the constituent metallic particles.

It is worth noting that the input electrodes i1, i2, . . . , iN and the output electrodes o1, o2, . . . , oM of the conductive module 10 can be deposited by standard thin film deposition techniques, e.g. by the physical vapor phase deposition technique known to a person skilled in the art. As mentioned above, the shape and position of such electrodes on the substrate 1 is determined by the use of appropriate masks. Such electrodes can also be made using masks obtained by photoresist lift-off processes or other typical known micro-manufacturing processes.

Preformed noble metal nanoparticles 6', produced in the gaseous phase, are configured to be deposited on the sur face 2 of the substrate 1 between the input electrodes i1, . . . , iN and the output electrodes o1, . . . , oM and to electrically connect the electrodes to one another. Such metal nanoparticles 6' may be produced according to one of the following techniques, which are mutually alternative:

- condensation of a vapor produced in the presence of an inert thermalization gas by thermal evaporation of a solid target;
- sputtering of a solid target;
- laser vaporization of a solid target;
- condensation of precursors obtained by thermal modification such as flame pyrolysis.

By way of example, the invention provides the use of gold nanoparticles 6' produced in the gaseous phase and deposited by supersonic cluster beam deposition to form continuous metallic film 6. According to a deposition technique employed in the embodiment of module 10 of the invention, such metal nanoparticles 6' are extracted from an appropriate cluster source through a supersonic expansion process to form a seeded beam of particles. Such a seeded beam is then deposited on the substrate 1 including the prefabricated electrodes, as indicated above. The deposition is performed through a masking process. It is worth noting that the continuous metallic film 6 obtained by assembling the deposited nanoparticles 6' and bridging all electrodes on the substrate 1 comprises an extremely large number of defects and junctions 8 which connect the individual nanoparticles.

FIGS. 2A, 2B, 2C describe an example of a junction of the metallic film 6 of the conductive module 10 the resistance of which can be changed by applying an encoding signal Simp to change the resistance of the conductive path between two selected electrodes, accordingly.

In the operational example of FIG. 2A, the conductive module 10 is configured to implement a weight function performed on an input current I through the different values associated with the electrical resistances of the conductive paths present in the metallic film 6 between pairs of electrodes of the module 10 itself.

Referring to FIG. 2A, in a first step, the conductive module 10 is characterized by a first configuration of resistors between the input electrodes i1, i2, i3, and the output electrodes o1, o2, o3 which implements a set of weights associated with the module 10. The reference I indicates such an input current applied to a first input electrode i1. The reference PD indicates the weak current conductive path, i.e., characterized by high junction resistance, between such a first input electrode i1 and a first output electrode o1. The reference PF indicates the strongest current path, characterized by low junction resistance, between such a first input electrode i1 and a second output electrode o2. In such a configuration, the first output electrode o1 makes available a first output current I1, which is smaller than the input current I. The second output electrode o2 of the module 10 makes available a second output current I2, which is less than the input current I, but greater than the first output current I1.

In a second step, shown in FIG. 2B, an electrical encoding signal Simp, in particular a pulse train voltage signal, is applied to the first input electrode i1. The first o1 and the third o3 output electrodes are connected to ground potential (GND). Reference G indicates the metallic film junctions 6 which may be altered by the current flow generated as a result of the application of such a voltage signal Simp. In other words, the local resistance of the junctions G changes as a result of the application of this current flow.

Once the resistance configuration of the conductive module 10 has been changed, i.e., the weights associated with that module 10 have been changed, in a third step, shown in FIG. 2C, the conductive paths between the first input terminal i1 and the first o1 and the second o2 output terminal have substantially the same resistance, based on the change made to the junction resistances. Therefore, the input current I, applied to the first input electrode i1, may follow two paths having substantially the same resistance, so that the first o1 and the second o2 output electrodes of the module 10 both make available the same output current I3, which is less than the input current I.

Examples of an embodiment of an electronic computing device 100 for generating Boolean functions of the invention are described with reference to FIGS. 3-4.

Figure 4:
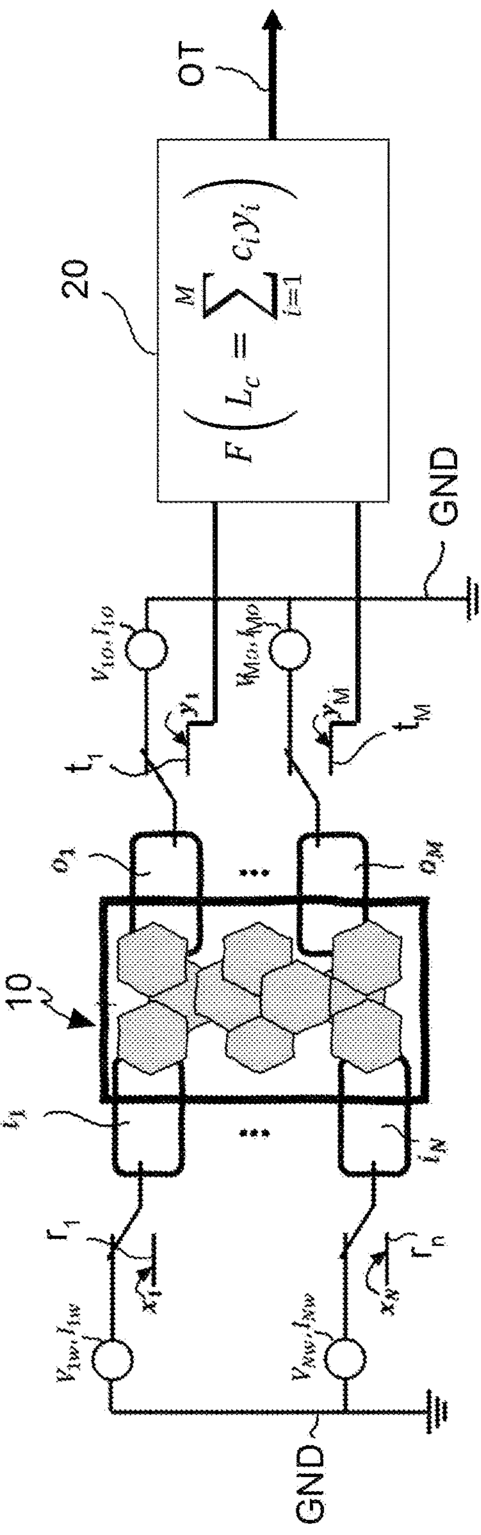
FIG. 4 illustrates an example of an embodiment of an electronic computing device for generating Boolean functions having a conductive module which comprises input electrodes N and output electrodes M.

Referring to the general example of FIG. 4, the electronic computing device 100 for generating Boolean functions, or simply computing device, comprises the conductive module 10 described above. Such a conductive module 10 comprises one or more first electrodes i1, i2, . . . , iN, to allow the application of electrical input signals to the conductive module 10, and one or more second electrodes o1, o2, oM, to make available electrical output signals from the conductive module 10.

Furthermore, the electronic processing device 100 comprises one or more first voltage V1*w*, . . . , VNw or current I1*w*, . . . , INw generators, each selectively connectible to one of said one or more first electrodes i1, i2, . . . , iN during a step of encoding of the computing device 100.

The electronic computing device 100 further comprises or more second voltage V1*o*, . . . , VMo or current I1*o*, . . . , IMo generators, selectively connectible to one of said one or more second electrodes o1, o2, . . . , oM during the step of encoding of the computing device 100.

Additionally, the computing device 100 comprises one or more input terminals r1, . . . , rN, each of which is selectively connectible to one of said one or more first electrodes i1, i2, . . . , iN of the conductive 10) to apply electrical input signals x1, . . . , xN to aforesaid one or more first electrodes during a step of processing of the computing device 100.

Furthermore, the computing device 100 comprises one or more output terminals t1, . . . , tM, each of which is selectively connectible to one of said one or more second electrodes o1, o2, . . . , oM of the conductive module 10 to make electrical output signals y1, . . . , yM available on said one or more second electrodes during the step of processing of the computing device 100.

The aforesaid selective connections are made by means of digital or analog switching switches.

Additionally, the computing device 100 comprises a functional block 20 connected to the aforesaid one or more output terminals t1, . . . , tM of the device 100 to receive in input such electrical output signals from the conductive module 10 and to generate an output signal OT, e.g. binary, obtained by processing the electrical output signals y1, . . . , yM made available on said one or more output terminals t1, . . . , tM.

By way of example, the electrical input signals x1, . . . , xN to the conductive module 10 and the electrical output signals y1, . . . , yM from the conductive module 10 are either electrical voltage signals or electrical current signals.

In an embodiment, the aforesaid functional block 20 comprises an electronic circuit configured to implement a linear combination of the electrical output signals y1, . . . , yM made available on said one or more output terminals t1, . . . , tM based on the expression $$L_c = \sum_{i=1}^{M} c_i y_i \quad (1)$$

and to generate the binary signal OT in output based on the expression $$OT = F(L_c), \quad (2)$$

with F being any function of a real variable which takes binary values and $c_i$ being constant coefficients dependent on the parameters of the electronic circuit and $$L_c(y_1, \ldots, y_M) = \Sigma'(x_1, \ldots, x_N) \quad (3)$$

wherein $$\Sigma' = x_1 w_1(x_1, \ldots, x_N) + \ldots + x_N w_N(x_1, \ldots, x_N) \quad (4)$$

with weight functions $$w_1 = c_1 w_1^1 + \ldots + c_M w_1^M, \ldots, w_N = c_1 w_N^1 + \ldots + c_M w_N^M \quad (5)$$

wherein $$w_i^j = w_i^j(x_1, \ldots, x_N) \quad (6)$$

is the weight function at the output j due to the input i.

In particular, the weight functions are the (mathematical) modeling of the different conductive paths mentioned above between a given input i and a given output j.

Figure 8:
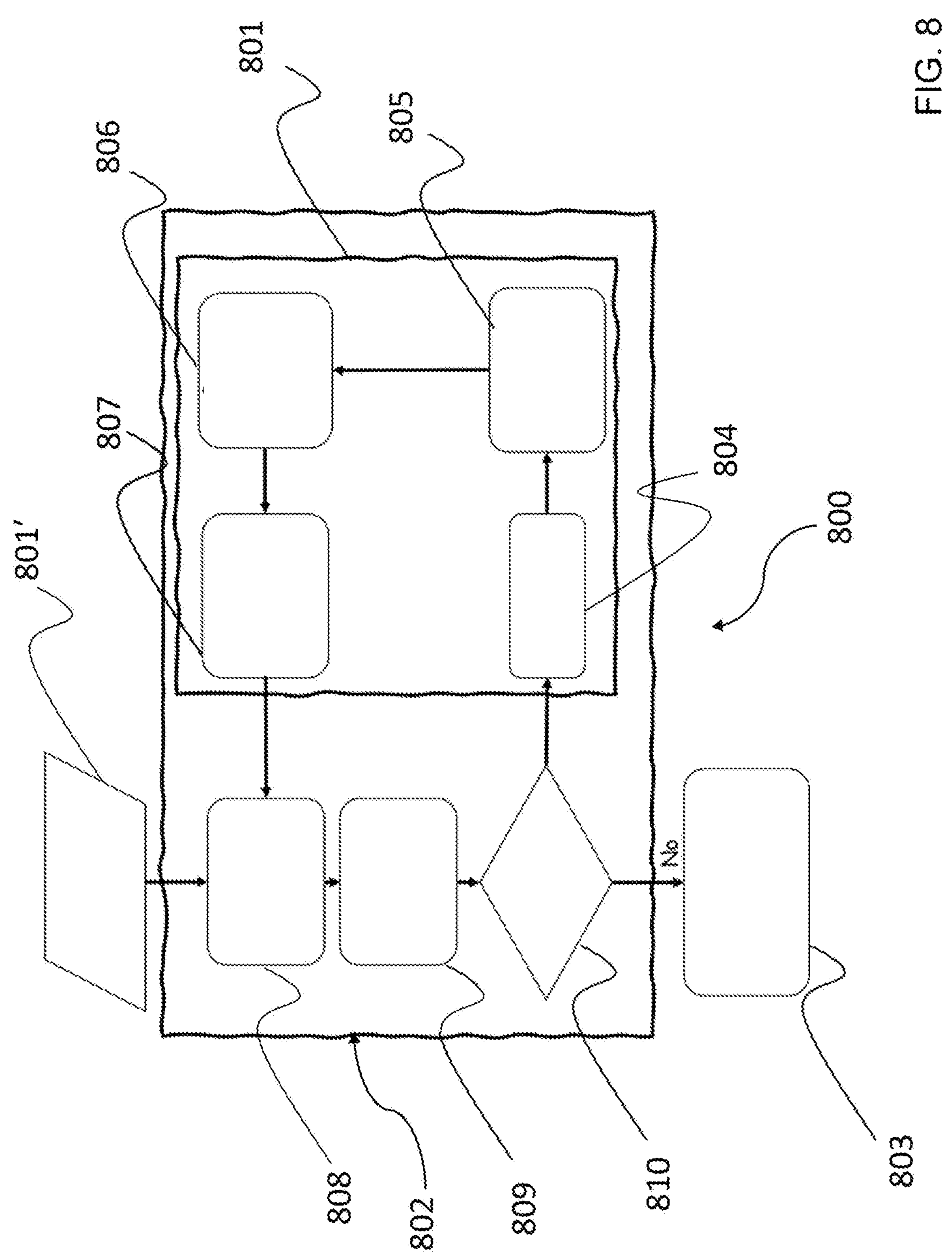
FIG. 8 illustrates, with a flowchart, the operational steps of the method for generating a Boolean function implemented with an electronic computing device of the invention.

An example of an embodiment of a method 800 for generating a Boolean function implemented through the electronic computing device 100 of the invention is illustrated with a flowchart with reference to FIG. 8.

Such a method of generating Boolean functions essentially comprises three steps, already partly mentioned above:

a step of encoding 801, a step of processing 802, a step of executing 803.

In greater detail, the method 800 comprises an initial step of selecting 801' a desired Boolean goal function GF to be generated.

Furthermore, the step of encoding 801 comprises a step of applying the electrical encoding signal Simp, either voltage or current, either continuous or pulsed, either equal to or greater than the aforementioned threshold voltage VTH of the film 6, to the first i1, . . . , iN and second o1, . . . , oM electrodes of the conductive module 10 of the computing device 100 selected in various random combinations and/or with a certain sequence of combinations. In other words, the aforesaid selection may be carried out to optimize the method through the use of an algorithm either in addition to or instead of the random selection.

Said step of applying the encoding signal is performed by means of the aforesaid one or more first voltage generators V1*w*, . . . , VNw or current generators I1*w*, . . . , INw and one or more second voltage generators V1*o*, . . . , VMo or current generators I1*o*, . . . , IMo.

This determines a change in the resistances of the selectable conductive paths within the metallic film 6 and, consequently, also a change in the distributed weight functions. Such a voltage (or current) encoding signal Simp can be applied randomly both in terms of the amplitude values of such a signal and in the combinations of the inputs and/or with a well-defined sequence and/or algorithm.

In greater detail, said step of encoding 801 of the method 800 comprises, after a start-up step 804, the following steps of:

- selecting 805 the input i1, . . . , iN and/or output oi, . . . , oM electrodes of the conductive module 10 to which the above-threshold encoding signals Simp are applied;
- selecting 806 the features of the over-threshold encoding signals Simp;
- applying 807 above-threshold encoding signals Simp to the selected input i1, . . . , iN and/or output oi, . . . , oM electrodes of the conductive module 10.

The method 800 further comprises the aforementioned step of processing 802 comprising the steps of:

- applying 808 to the input terminals r1, . . . , rN of the computing device 100 a sequence of under-threshold electrical signals to obtain a respective sequence of electrical output signals y1, . . . , yM and of processing 809, e.g., single-threshold, double-threshold, or multi-threshold, said sequence of voltage signals through the functional block 20 to generate a current function to be compared with the Boolean goal function GF through a binary value of the output signal OT. In other words, the output signal OT allows the comparison to be performed. Substantially, by varying the inputs x1, . . . , xN the method verifies whether the output OT of the current function is equal to that of the goal function.

As mentioned above, the functional block 20 is configured to calculate a linear combination Lc of the electrical output signals y1, . . . , yM. Such a linear combination is an analog signal. In an example embodiment of the present invention, the signal obtained from equation (2), OT=F(Lc) is a digital signal.

However, in a different embodiment, it can be expected that the signal at the output of the functional block 20 is still an analog signal.

In particular, during the step of processing 802, the aforesaid signals are chosen under-threshold so as not to substantially change the weight functions which were associated with the conductive module 10 at the conclusion of the step of encoding 801.

Furthermore, the method 800 comprises a step of alternately repeating 810 said step of encoding 801 and said step of processing 802 until generating the desired Boolean goal function GF.

The successive step of executing 803 of the method 800 comprises a step of applying to the input terminals r1, . . . , rN of the computing device 100 a sequence of under-threshold input signals to solve the Boolean function GF generated at the end of the steps of encoding 801 and processing 802.

During the step of executing 803, the weight functions remain substantially unchanged to solve the goal function GL, depending on the computational requirements.

Figure 3:
FIG. 3 illustrates an example of an embodiment of an electronic computing device for generating Boolean functions having a conductive module which comprises three input electrodes and two output electrodes.
Figure 3:
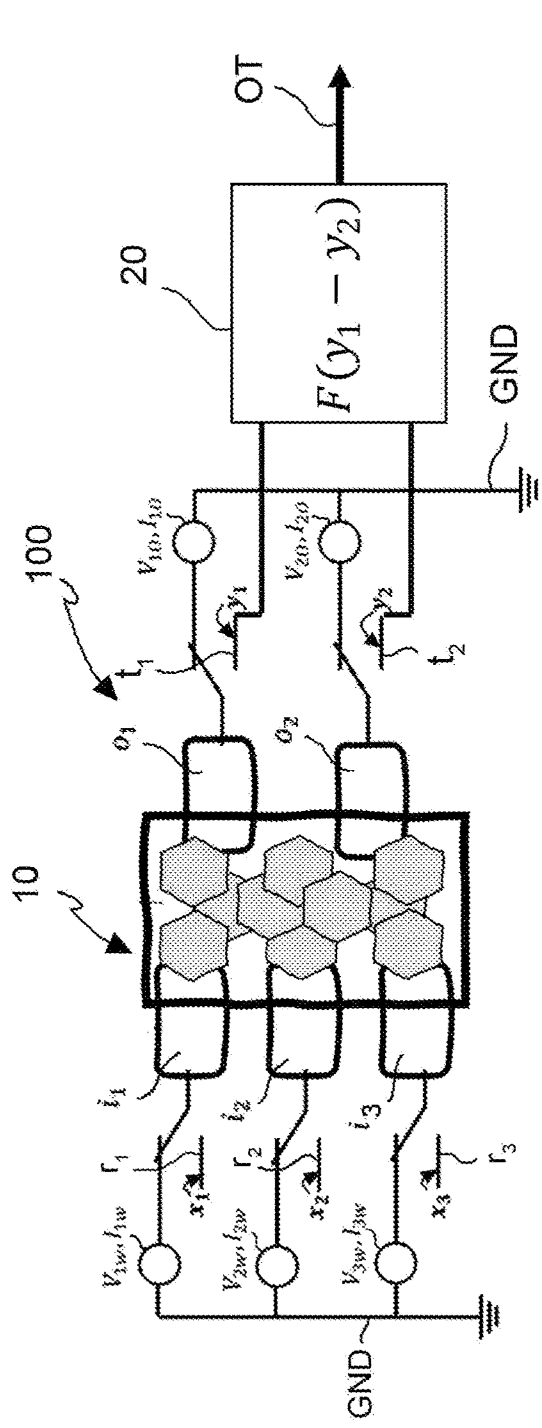

Referring to the embodiment in FIG. 3, the electronic computing device 100 includes a conductive module 10 which comprises three input electrodes i1, i2, i3, and two output electrodes o1, o2. Said electronic computing device 100 comprises three voltage generators V1*w*, V2*w*, V3*w* or current generators I1*w*, I2*w*, I3*w* input each connectible to one of said input electrodes i1, i2, i3 of the conductive module 10, through switches, during the step of encoding 801 of the computing device 100 mentioned above.

Furthermore, the electronic computing device 100 comprises two voltage or current I1O, I2O output generators V1O, V2O, each connectible to one of said output electrodes o1, o2 of the module 10 by switching the same switches during the step of encoding 801 of the computing device 100.

It is worth noting that both the input voltage generators V1*w*, V2*w*, V3*w*, and the output voltage generators V1O, V2O can also apply an electrical potential equal to zero (no voltage) to the electrodes of module 10. Furthermore, both the input voltage generators I1*w*, I2*w*, I3*w*, and the output voltage generators I1O, I2O can also apply an electrical potential equal to zero (no voltage) to the electrodes of module 10.

In such a step of encoding, a threshold voltage VTH associated with the metallic film 6 of the conductive module 10 is identified starting from the application of encoding voltage (or current) signals Simp, through input voltage generators V1*w*, V2*w*, V3*w*, or current I1*w*, I2*w*, I3*w*, initially having amplitudes which generate voltage values on the film 6 which are lower than the threshold voltage VTH. Such signals Simp do not determine any change in the electrical resistance of the conductive paths in the continuous metallic film 6.

In particular, it is contemplated to vary the amplitude of the encoding voltage (or current) Simp until the electrical resistance associated with the metallic film 6 is varied. Once the threshold voltage VTH of metallic film 6 is exceeded, the resistance of the conductive paths is changed, and thus the distribution of weight functions, as described above with reference to FIG. 2B showing the effects of applied stimuli having amplitudes above the threshold voltage VTH.

Successively, the supra-threshold voltages or currents are applied to trigger the encoding process.

During the successive step of processing 802, to compare the current output function with a goal function GF, the input electrodes i1, i2, i3 of the device 100 are switched to the input terminals r1, r2, r3 providing respective voltage (or current) input signals x1, x2, x3, and the output electrodes o1, o2 are switched to the output terminals t1, t2 connected to the input of the functional block 20. Such a functional block 20 is configured to provide the output binary OT signal.

It is worth noting that a plurality of encoding and processing steps are performed alternately until the current output function of the device 100 corresponds to the desired goal function GL. In particular, each step of encoding 801 is repeated by changing the amplitude of the over-threshold voltage or by changing the input-output electrodes of the conductive module 10, which are stimulated.

The status of the binary output OT is provided using such a functional block 20 which receives, as voltage (or current) inputs, the signals on the output terminals t1, t2 connected to the conductive module 10.

In particular, such a functional block 20 comprises an electronic circuit comprising standard analog circuits, such as, for example, differential amplifiers or adders adapted to compute the linear combination Lc, and standard operational amplifiers, single-threshold comparators, or multi-threshold comparators (such as window comparators) for implementing the output function F, i.e., the goal function.

An embodiment of the electronic computing device 100 of the invention which implements a one-input and one-output logic gate is described with reference to FIG. 5.

Such a single-bit logic gate (logical 0 or 1) on the input terminal r1 is configured to generate four possible functions F1, F2, F3, F4 on the output as shown in Table 1.

TABLE 1

| $x_1$ | $F_1(x_1)$ | $F_2(x_1)$ | $F_3(x_1)$ | $F_4(x_1)$ |
|---|---|---|---|---|
| 0 | 0 | 0 | 1 | 1 |
| 1 | 0 | 1 | 0 | 1 |

In particular, the third function F3 on the output implements the Boolean algebra "inverter" (NOT) logic gate. Such an electronic computing device 100 may be made by repeating the encoding process until the conductive module 10 maps the digital input x1, e.g., voltage, applied to the input terminal r1 to an analog value y1, e.g., current, applied to the output terminal t1 so that the analog values of the output signals corresponding to bits 0 and 1 of the input signal are:

$$y1(0)<Ith \text{ and } y1(1)>Ith$$

where Ith is the threshold current of a threshold comparator constituting functional block 20 adapted to implement the goal function GF. An example of the transfer function of such a threshold comparator is shown in FIG. 5A, where the reference I' indicates the input current to the threshold comparator 20 and Vo is the output voltage from the comparator.

It is worth noting that the following analog values can also be mapped to the output terminal y1 of the computing device 100 during runtime processes:

$$y1(0)<Ith \text{ and } y1(1)<Ith.$$

Figures 5, 7:
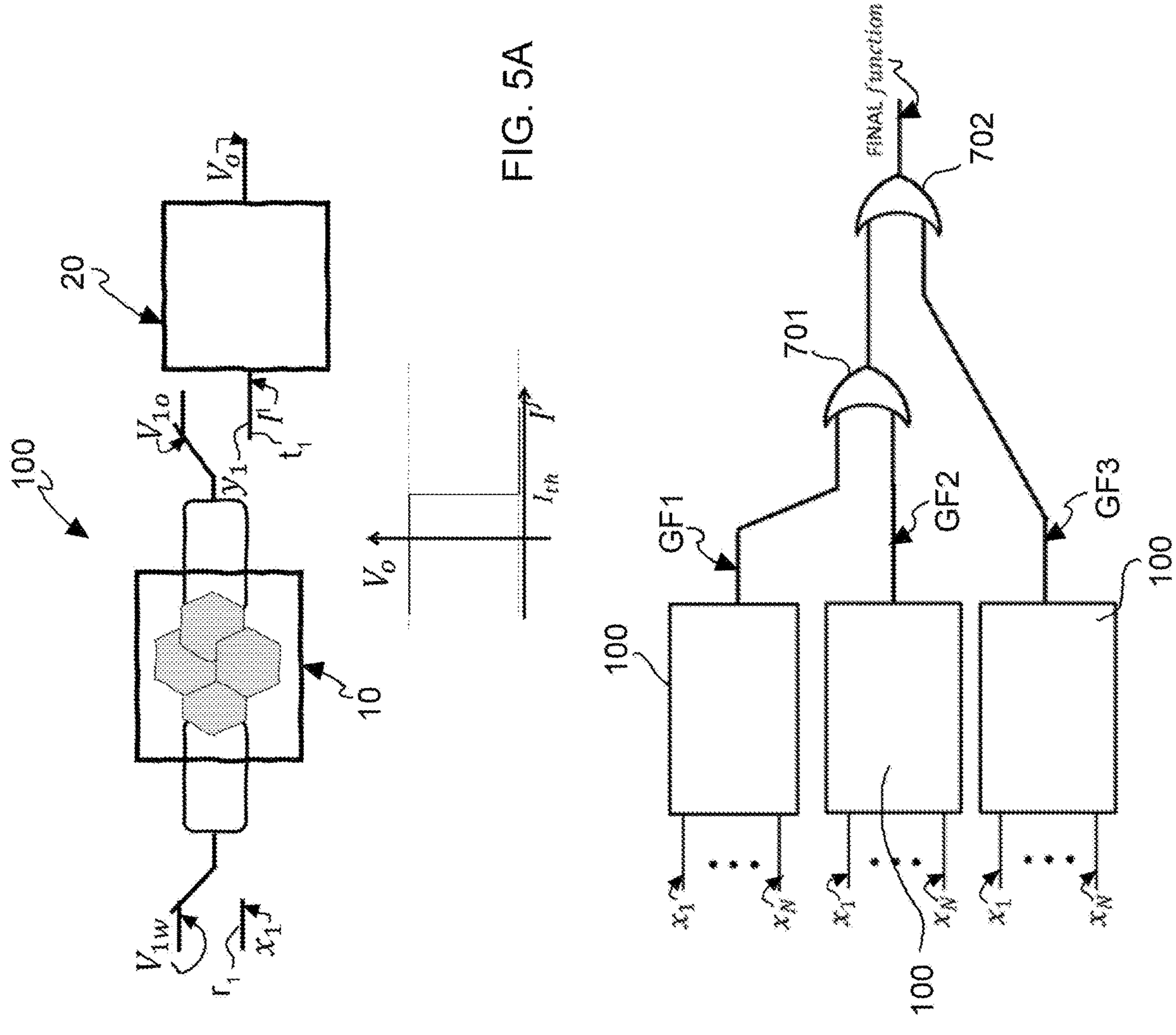

Therefore, the electronic computing device 100 in FIG. 5 allows encoding both the third F3 and fourth F4 functions of Table 1.

Furthermore, although in the suggested example the logic state on the input terminal r1 is a voltage and the analog output t1 is a current signal, in general, both inputs and outputs can be indifferently voltages or currents.

Example numerical values for implementing the NOT logic gate (function F3) with the computing device 100 of the invention are:

$$Ith=0.10 \text{ mA}, x1=5 \text{ V(logic state "1")}, x1=0 \text{ V(logic state "0")}, y1(0)=0 \text{ mA}, y1(1)=0.15 \text{ mA}, V1w=5 \text{ V}, V1o=0 \text{ V}.$$

An example of an embodiment of the electronic computing device 100 of the invention which implements a two-input and one-output logic gate is described with reference to FIG. 6.

The conductive module 10, in this case, comprises two input electrodes i1, i2, and two output electrodes o1, o2.

The logic gate with two-bit inputs generates sixteen possible goal functions GF.

Figures 6, 6A:
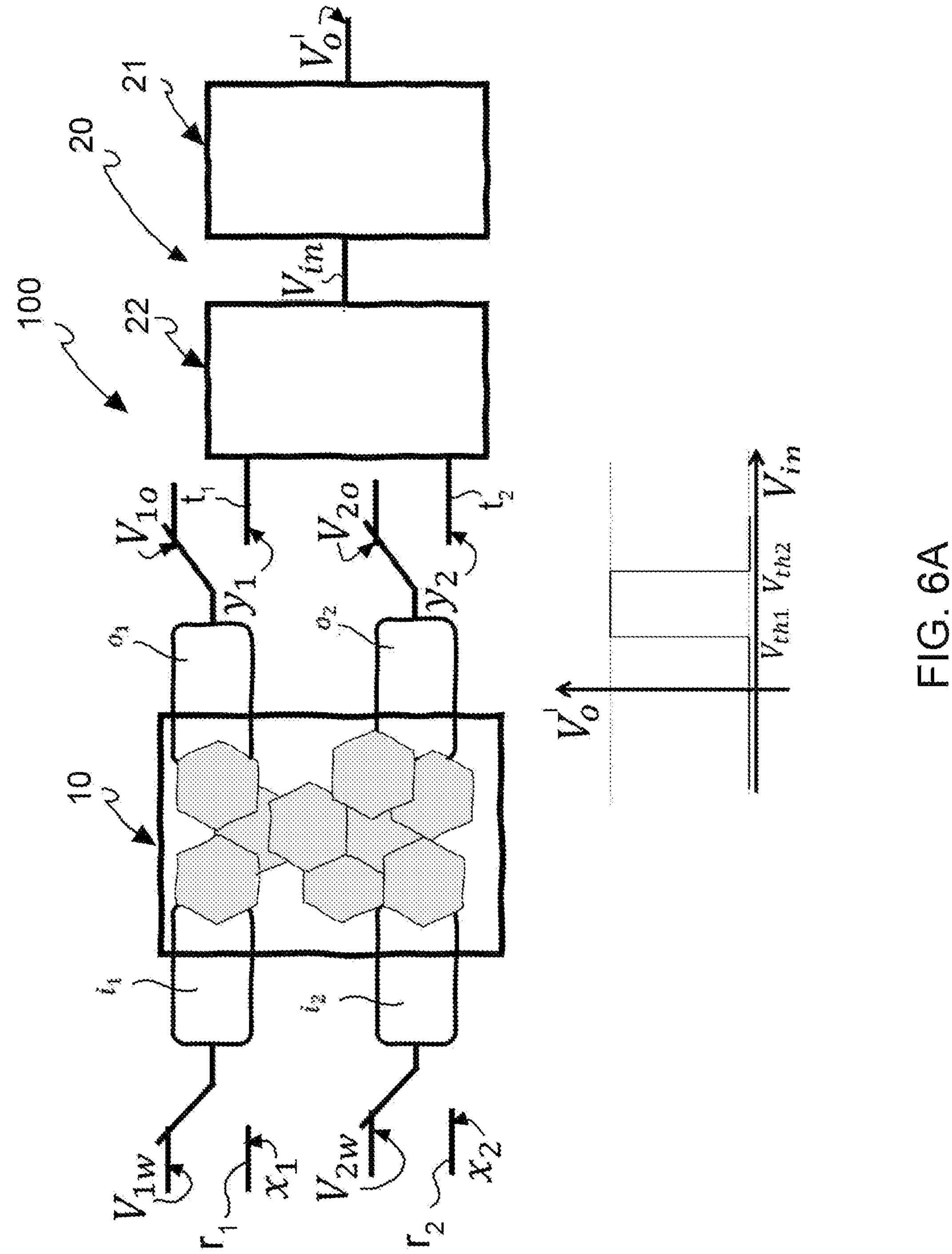
FIGS. 6, 6A respectively illustrate an example of an embodiment of an electronic computing device of the invention, having a conductive module which comprises two input electrodes and two output electrodes, which implements a two-input and one-output logic gate and a transfer function of a dual-threshold comparator of the computing device.

The Boolean function XOR, for example, can be made with the electronic computing device 100 in FIG. 6 by repeating the encoding process until the conductive module 10 maps the digital (voltage) inputs x1, x2 to analog (voltage) values y1, y2, so that:

$$y1(0)-y2(0)<Vth1,$$

$$Vth1<y1(0)-y2(1)<Vth2,$$

$$Vth1<y1(1)-y2(0)<Vth2,$$

$$y1(1)-y2(1)>Vth2,$$

where Vth1 and Vth2 are the threshold voltages of a dual-threshold comparator 21 which implements the goal function, while the voltage difference y1–y2 can be made with a differential amplifier 22. Such dual-threshold comparator 21 and such differential amplifier 22 constitute the functional block 20 to make the function F in FIG. 4.

An example of the transfer function of such a dual-threshold comparator 21 is shown in FIG. 6A, where Vin is the input voltage to the comparator and Vo' is the output voltage from the comparator.

It is worth noting that the following analog values can also be mapped to the output terminals y1, y2 of device 100 during runtime processes:

$$y1(0)-y2(0)<Vth1,$$

$$Vth1<y1(0)-y2(1)<Vth2,$$

$$Vth1<y1(1)-y2(0)<Vth2,$$

$$Vth1<y1(1)-y2(1)<Vth2.$$

These conditions implement the Boolean algebra OR logic gate. Of course, other mappings and functions are possible.

For example, to implement the AND logic gate, the conductive module 10 is configured to map the digital input signals x1, x2 applied to the input terminals r1, r2 onto the analog output signals y1, y2 made available at the output terminals t1, t2, such that:

$$y1(0)-y2(0)<Vth1,$$

$$y1(0)-y2(1)<Vth1,$$

$$y1(1)-y2(0)<Vth1,$$

$$Vth1<y1(1)-y2(1)<Vth2.$$

In other words, by means of the same electronic computing device 100, it is possible to encode different Boolean logic functions XOR, OR, AND as a result of the modification of the resistances of the conductive paths in the metallic film 6 of the conductive module 10 obtained at the end of the encoding process described above.

Referring to the example in FIG. 7, a plurality of electronic computing devices 100 of the invention, each having N inputs, may be combined through other Boolean operators to make any complex Boolean function or FINAL function.

In particular, FIG. 7 shows three computing devices 100 at N input signals x1, . . . , xN, equal to each other, each configured to generate an output goal function GF. The output of the first computing device 100 makes the first goal function GF1 available to a first input of a first two-input OR logic gate 701. The output of the second computing device 100 makes the second GF2 goal function available to a second input of the first two-input OR logic gate 701.

A respective output of such first logic gate 701 constitutes the first input to a second two-input OR logic gate 702. The output of the third computing device 100 makes the third goal function GF3 available to a second input of the second two-input OR logic gate 702, to generate the aforementioned FINAL function.

By such a combination process, any Boolean function (FINAL function) can be obtained by exploiting the goal functions GF generated by various electronic computing devices 100 of the invention by using complex or elementary Boolean operations such as OR, AND, NOR, NAND, EXOR, EXNOR. This combination process is used to reduce the execution time of writing-learning processes.

The electronic computing device 100 for generating Boolean functions and the corresponding conductive module 10 have numerous advantages and achieve their intended purposes.

In particular, the Applicant has verified that the electronic computing device 100 of the invention reduces circuit complexity in making Boolean functions compared to the use of CMOS technology.

Furthermore, the electronic computing device 100 includes a conductive module 10 having a structure which can be made by a simpler manufacturing process than that employed in CMOS technology and is of low cost.

Furthermore, the electronic computing device 100 is of a modular type, that is, it can be combined with other similar devices to form sets of Boolean functions or combinations of Boolean functions.

A person skilled in the art may make changes and adaptations to the embodiments of the electronic computing device generating Boolean functions and to the conductive module thereof described above or can replace elements with others which are functionally equivalent to satisfy contingent needs without departing from the scope of protection of the appended claims. All the features described above as belonging to a possible embodiment may be implemented independently of the other embodiments described.

The invention claimed is:

1. A conductive module for an electronic computing device, said electronic computing device being configured for generating Boolean functions, the conductive module comprising:
 a substrate comprising a flat surface;
 one or more first electrodes operatively associated with said flat surface of the substrate to allow the application of electrical input signals to the module,
 one or more second electrodes operatively associated with said flat surface of the substrate to make available electrical output signals from the module,
 said one or more first electrodes and said one or more second electrodes delimiting a portion of said flat surface of the substrate;
 a continuous metallic film formed by deposition on the portion of said flat surface of substrate of a plurality of crystalline particles of a noble metal, wherein each of said crystalline particles of said continuous metallic film is in contact with one or more of said other crystalline particles of said metallic film to form one or more grain boundaries, said continuous metallic film being interposed between the one or more first electrodes and the one or more second electrodes to electrically connect each of said one or more first electrodes to each of said one or more second electrodes.

2. A conductive module for an electronic computing device (100) according to claim 1, wherein any one of said one or more first electrodes is connected to one of the one or more second electrodes by one or more respective conductive current paths selected within the metallic film,
 an electrical resistance, associated with said one or more conductive current paths, may be modified from a first resistance value to a second resistance value, applying an electrical encoding signal adapted to generate a voltage, between any one of said one or more first electrodes and one of the one or more second electrodes connected by the selected conductive current path, having an amplitude greater than or equal to a threshold voltage value.

3. A conductive module for an electronic computing device according to claim 1, wherein said crystalline particles are gold particles.

4. A conductive module for an electronic computing device according to claim 1, wherein said substrate comprises a solid substrate comprising silicon or glass, or a flexible substrate comprising polymeric materials.

5. A conductive module for an electronic computing device according to claim 1, wherein said continuous metallic film has a thickness of between 15 nm and 100 nm and a porosity of up to 0.5 times the porosity of the solid metal.

6. A conductive module for an electronic computing device (100) according to claim 1, wherein said crystalline particles of noble metal forming the continuous metallic film are gold nanoparticles, each having an average diameter of between 1 nm and 15 nm.

7. A conductive module for an electronic computing device according to claim 2, wherein said electrical encoding signal is a voltage or current signal.

8. A conductive module for an electronic computing device according to claim 7, wherein said electrical encoding signal is a continuous signal or a signal formed by a train of pulses.

9. A conductive module for an electronic computing device according to claim 6, wherein the continuous metallic film formed by depositing said plurality of crystalline particles of a noble metal comprises a plurality of non-linear junctions configured to form conductive current paths within the metallic film between each of said one or more first electrodes and any one of the one or more second electrodes, said conductive current paths having different electrical resistance from one another.

10. A conductive module for an electronic computing device according to claim 1, wherein said continuous metallic film has a thickness of between 30 nm and 60 nm and a porosity of up to 0.5 times the porosity of the solid metal.

11. A conductive module for an electronic computing device according to claim 1, wherein said crystalline particles of noble metal forming the continuous metallic film are produced in gaseous phase.

12. A conductive module for an electronic computing device according to claim 11, wherein said crystalline particles produced in the gaseous phase are gold nanoparticles deposited by deposition of supersonic cluster beams to form said continuous metallic film.

13. An electronic computing device for generating Boolean functions, comprising:
 a conductive module according to claim 1, comprising one or more first electrodes, to allow the application of electrical input signals to the conductive module, and one or more second electrodes, to make available electrical output signals from the conductive module;
 one or more first voltage or current generators, each selectively connectable to one of said one or more first electrodes during an encoding step of the electronic device;
 one or more second voltage or current generators, each selectively connectable to one of said one or more second electrodes during the encoding step of the electronic device;
 one or more input terminals each of which is selectively connectable to one of said one or more first electrodes of the conductive module to apply electrical input signals to said one or more first electrodes during a processing step of the electronic device;
 one or more output terminals each of which is selectively connectable to one of said one or more second electrodes of the conductive module to make electrical output signals available on said one or more second electrodes during the processing step of the electronic device;
 a functional block connected to said one or more output terminals to receive in input said electrical output signals from the conductive module and to generate an output signal obtained by processing the electrical output signals made available on said one or more output terminals.

14. An electronic computing device according to claim 13, wherein said electrical input signals and said electrical output signals are electrical voltage signals or electrical current signals.

15. An electronic computing device according to claim 13, wherein said functional block comprises an electronic circuit configured to implement a linear combination of the electrical output signals made available on said one or more output terminals on the basis of the expression $$L_c = \sum_{i=1}^{M} c_i y_i$$

and to generate said output signal from the device (100) on the basis of the expression $$OT=F(L_c),$$

with F being any function of a real variable which takes binary values and $c_i$ being constant coefficients dependent on the parameters of the electronic circuit and wherein $$L_c(y_1, \ldots, y_M)=\Sigma^i(x_1, \ldots, x_N)$$

$$\Sigma^i=x_1w_1(x_1, \ldots, x_N)+ \ldots +x_Nw_N(x_1, \ldots x_N)$$

with weight functions $$w_1 = c_1w_1^1 + \ldots + c_Mw_1^M, \ldots , w_N = c_1w_N^1 + \ldots + c_Mw_N^M$$

with $$w_i^j = w_i^j(x_1, \ldots , x_N)$$

being the weight function at the output j due to the input i.

16. A method for generating Boolean functions implemented by an electronic computing device, in accordance with claim 13, employing a conductive module, in accordance with claim 1, said method comprising:

a step of selecting a goal Boolean function to be generated;

an encoding step comprising a step of applying an electrical encoding signal to the first and the second electrodes of the conductive module of the device selected in different random combinations and/or with a predetermined sequence of combinations, said step of applying the encoding signal being executed by one or more first voltage or current generators and one or more second voltage or current generators;

a processing step comprising the steps of:

applying to the input terminals of the computing device a sequence of under-threshold electrical signals to obtain a respective sequence of electrical output signals on output terminals of the computing device, calculating a linear combination of said electrical output signals;

processing said sequence of voltage signals by a functional block to generate a current function to be compared with said goal Boolean function on the basis of a value of the output signal;

step of alternately repeating said encoding step and said processing step until generating the goal Boolean function; an executing step comprising a step of applying to the input terminals of the computing device a sequence of under-threshold input signals to solve the Boolean function generated at the end of the encoding and processing steps.

17. A method for generating Boolean functions according to claim 16, wherein said encoding step comprises the further steps of:

selecting the input and/or output electrodes of the conductive module on which to apply the above-threshold encoding signals;

selecting the features of the over-threshold encoding signals;

applying above-threshold encoding signals to the selected input and/or output electrodes of the conductive module.

18. A method for manufacturing a conductive module of an electronic computing device, said electronic computing device being configured for generating Boolean functions, comprising the steps of:

providing a substrate comprising a flat surface;

forming one or more first electrodes operatively associated with said flat surface of the substrate, forming one or more second electrodes operatively associated with said flat surface of the substrate, said one or more first electrodes and said one or more second electrodes delimiting a portion of said flat surface of the substrate;

depositing, by a mask, on the portion of said flat surface of substrate a plurality of crystalline particles of a noble metal for forming a continuous metallic film, wherein each of said crystalline particles of said continuous metallic film is in contact with one or more of said other crystalline particles of said metallic film to form one or more grain boundaries, said continuous metallic film being interposed between the one or more first electrodes and the one or more second electrodes to electrically connect each of said one or more input electrodes to each of said one or more output electrodes.

* * * * *